(12) United States Patent
Yasukawa et al.

(10) Patent No.: US 6,680,490 B2
(45) Date of Patent: Jan. 20, 2004

(54) LIGHT-EMITTING DEVICE

(75) Inventors: Takemasa Yasukawa, Nishikasugai-gun (JP); Akira Mabuchi, Nagoya (JP); Yasuji Ozaki, Nishikasugai-gun (JP); Kenichi Watanabe, Nishikasugai-gun (JP); Satoshi Honda, Niiza (JP); Tsutomu Yokota, Iruma-gun (JP)

(73) Assignees: Toyoda Gosei Co., Ltd., Aichi-ken (JP); Sanken Electric Co., Ltd., Saitama (JP)

( * ) Notice: Subject to any disclaimer, the term of this patent is extended or adjusted under 35 U.S.C. 154(b) by 0 days.

(21) Appl. No.: 10/167,504

(22) Filed: Jun. 13, 2002

(65) Prior Publication Data

US 2003/0006421 A1 Jan. 9, 2003

(30) Foreign Application Priority Data

Jun. 15, 2001 (JP) ........................................ P2001-182544

(51) Int. Cl.[7] ........................ H01L 29/22; H01L 29/227; H01L 29/24; H01L 23/495; H01L 23/14; H01L 23/12

(52) U.S. Cl. .................. 257/98; 257/99; 257/100; 257/676; 257/702; 257/704

(58) Field of Search ................................ 257/702, 703, 257/704, 99, 98, 100, 675, 676

(56) References Cited

U.S. PATENT DOCUMENTS

| | | | | |
|---|---|---|---|---|
| 6,066,861 A | * | 5/2000 | Hohn et al. ..................... | 257/99 |
| 6,242,280 B1 | * | 6/2001 | Koay et al. .................. | 438/106 |
| 6,407,411 B1 | * | 6/2002 | Wojnarowski et al. ......... | 257/99 |
| 2002/0080501 A1 | * | 6/2002 | Kawae et al. ................ | 359/799 |
| 2002/0121645 A1 | * | 9/2002 | Yasukawa et al. ............. | 257/99 |

* cited by examiner

*Primary Examiner*—Nathan J. Flynn
*Assistant Examiner*—Victor A. Mandala, Jr.
(74) *Attorney, Agent, or Firm*—McGinn & Gibb, PLLC

(57) ABSTRACT

After a light-emitting element exhibiting an emission peak wavelength in a wavelength range of not longer than 500 nm is mounted into a cup-like portion of a base member, the cup-like portion is filled with epoxy group-containing silicone rubber. An aromatic polyamide-based resin is used as a reflector material.

20 Claims, 3 Drawing Sheets

LIGHT-EMITTING DEVICE

The present application is based on Japanese Patent Application No. 2001-182544, which is incorporated herein by reference.

BACKGROUND OF THE INVENTION

1. Field of the Invention

The present invention relates to a light-emitting device and particularly to a device using a light-emitting element which emits light in a relatively short wavelength range. The light-emitting device according to the invention can be used as a light source for illumination or as a light source for various kinds of display devices.

2. Description of the Related Art

A device configured as shown in FIG. 5 is known as a light-emitting device using a light-emitting element. FIG. 5 typically shows an SMD (Surface Mounted Device) type LED 100. The LED 100 is produced as follows. A light-emitting element 110 is disposed into a cup-like portion 150 formed by a combination of a substrate 120 and a reflector (casing) 130. The cup-like portion 150 is filled with a sealing member 140 (light-transmissive resin). The reflector 130 is made of a polymer resin containing a white filler such as titanium oxide. On the other hand, the sealing member 140 is generally made of an epoxy resin.

Under the existing circumstances, the light-emitting element used in the SMD type LED exhibits an emission peak wavelength in a relatively long wavelength range such as a red region. The epoxy resin used as the sealing member is relatively durable against light emitted from the light-emitting element. Accordingly, the color in the epoxy resin may be more or less changed in long-term use but the degree of the change of the color is small.

Incidentally, a short wavelength light-emitting element exhibiting an emission peak wavelength in an ultraviolet region has been being developed in the expectation that the element will be applied to an SMD type LED. Therefore, the present inventors have tried to form an SMD type LED by use of a short wavelength light-emitting element. As a result, it has been found that the deterioration (color change) of the sealing member is too fast to withstand practical use in terms of durability when an epoxy resin is used as the sealing member in the related-art manner.

On the other hand, in order to secure the stability and reliability of the light-emitting device, it is necessary to form the sealing member in a state in which no gap is generated between the sealing member and a base member (including a reflector) on which the light-emitting element is mounted. That is, sufficient adhesion (close contact) is required between the sealing member and the base member.

SUMMARY OF THE INVENTION

The inventors have examined the material of the sealing member and the base member in consideration of the problem. As a result, it has been found that silicone as the material of the sealing member exhibits very high durability against light in a short wavelength region. From the point of view of adhesion between the sealing member and the base member, the inventors also have made examination. According to the examination result, it has been found that good adhesion is obtained between the sealing member and the base member when a polyamide-based resin is used as the base member in the case where silicone is used as the sealing member. The invention is based on the findings and is configured as follows.

A light-emitting device including a semiconductor light-emitting element, a base member provided so that the semiconductor light-emitting element is mounted on the base member, and a sealing member provided so that the semiconductor light-emitting element is coated with the sealing member, wherein:

at least one portion of the base member is made of a polyamide-based resin; and at least one portion of the sealing member is made of silicone.

According to this configuration, sufficient adhesion (close contact) is obtained between the sealing member and the base member, so that the sealing member can be formed in a state in which no gap is generated between the sealing member and the base member. Accordingly, both stability and reliability of the light-emitting device are improved. In addition, because silicone exhibiting high durability against light in a short wavelength region is used as the material of the sealing member, the deterioration of the sealing member is suppressed to improve durability of the light-emitting device particularly when a short wavelength semiconductor light-emitting element is used.

Features and advantages of the invention will be evident from the following detailed description of the preferred embodiments described in conjunction with the attached drawings.

DETAILED DESCRIPTION OF THE PREFERRED EMBODIMENTS

Figure 1:
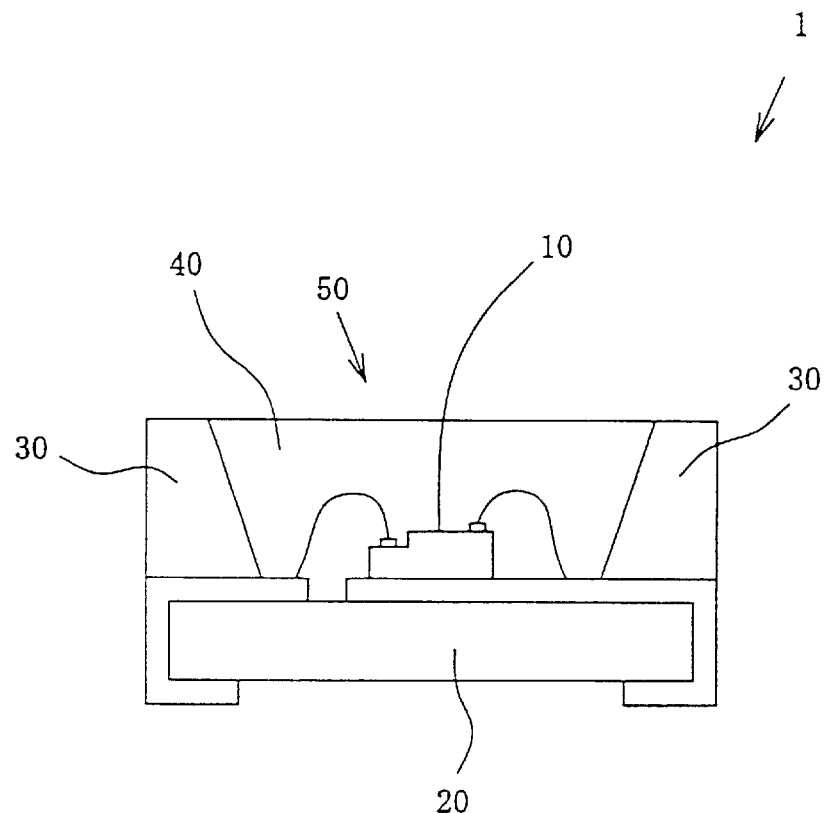
FIG. 1 is a view typically showing the configuration of a light-emitting diode as an embodiment of the invention.

Respective constituent members of the light-emitting device according to the invention will be described below.

(Semiconductor Light-Emitting Element)

A semiconductor light-emitting element exhibiting an emission peak wavelength in a wavelength range of not longer than 500 nm is preferably used as the semiconductor light-emitting element. More preferably, a semiconductor light-emitting element exhibiting an emission peak wavelength in a wavelength range of not longer than 400 nm may be used as the semiconductor light-emitting element. Further preferably, a semiconductor light-emitting element exhibiting an emission peak wavelength in a wavelength range of from 370 to 390 nm may be used as the semiconductor light-emitting element.

A semiconductor light-emitting element having a plurality of emission peaks may be used as well as a semiconductor light-emitting element having a single emission peak. Incidentally, when a semiconductor light-emitting element having a plurality of emission peaks is used, the semiconductor light-emitting element may exhibit one emission peak or two or more emission peaks in a wavelength region longer than 500 nm.

If the semiconductor light-emitting element has such wavelength characteristic, the configuration of the semiconductor light-emitting element is not particularly limited. For example, a semiconductor light-emitting element having a light-emitting layer made of a Group III nitride compound semiconductor can be used. Here, Group III nitride compound semiconductors are generally expressed as quarternary compounds represented by the general formula $Al_xGa_yIn_{1-X-Y}N$ ($0 \leq X \leq 1$, $0 \leq Y \leq 1$, $0 \leq X+Y \leq 1$), which includes so-called binary compounds such as AlN, GaN and InN, and so-called ternary compounds such as $Al_xGa_{1-x}N$, $Al_xIn_{1-x}N$ and $Ga_xIn_{1-x}N$ ($0 < x < 1$). The group III elements may be partially replaced by boron (B), thallium (Tl), etc. The nitrogen (N) may be partially replaced by phosphorus (P), arsenic (As), antimony (Sb), bismuth (Bi), etc. The light-emitting layer may contain any optional dopant.

(Base Member)

The base member is a member on which the semiconductor light-emitting element is mounted. At least one portion of the base member is made of a polyamide-based resin.

The concept "base member" in this specification includes a base member as a single member, and a base member as a combination of a plurality of members. An example of the former base member as a single member may be a member molded out of a specific material so that a cavity portion (cup-like portion) is formed on one surface side. In this case, a frame may be inserted in the base member. On the other hand, an example of the later base member as a combination of a plurality of members may be a combination of a casing and a substrate. For example, the base member can be formed so that a casing having a desired shape is bonded onto a substrate in order to form a cavity portion (cup-like portion). Alternatively, a base member made of only a substantially flat substrate may be used as the base member.

Here, the "cavity portion (cup-like portion)" formed in the base member means a portion which has a bottom portion and a side portion and is constituted by a space shaped like a form in which the area of a section in a direction perpendicular to the optical axis increases continuously or stepwise from the bottom portion to the light-extracting direction of the light-emitting device. The shapes of the bottom portion and the side portion are not particularly limited if this condition is satisfied.

At least one portion of the base member is made of a polyamide-based resin. When such a base member is used, adhesion between a sealing member (which will be described later) and the surface of the base member is made so high that both stability and reliability of the light-emitting device are improved.

From the point of view of enhancing adhesion between the sealing member and the surface of the base member to thereby improve both stability and reliability of the light-emitting device, it is preferable that the whole surface of the base member touching the sealing member is made of this material. When a base member having a cup-like portion is used, it is preferable that the whole surface of the base member constituting the cup-like portion is made of this material, in consideration of facilitation of producing the base member and facilitation of setting the condition for forming the sealing member. As a preferred mode, the base member as a whole may be made of this material. Such a base member can be produced by molding using this material.

Specifically, the base member as a whole can be made of a polyamide-based resin. When the base member is constituted by a combination of a substrate and a casing, both the substrate and the casing may be made of a polyamide-based resin. It is a matter of course that either the substrate or the casing may be made of a polyamide-based resin. Incidentally, the base member may be formed by use of a plurality of polyamide-based resins different in composition.

The base member may contain a light-reflective filler. In this manner, light emitted from the light-emitting element can be reflected with high efficiency by the surface of the base member, so that luminance of light emitted from the light-emitting device is improved.

From the point of view of improvement in adhesion between the base member and the sealing member, it is preferable that an aromatic polyamide-based resin selected from the polyamide-based resins is used. The "aromatic polyamide-based resin" means a resin of polyamide having an aromatic ring as a main chain. The aromatic polyamide-based resin is not particularly limited in kind. For example, there may be used an aromatic Nylon resin represented by the following general formula:

Chemical Formula 1

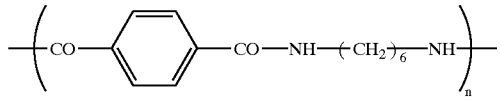

The light-reflective filler is not particularly limited in kind. A material high in light reflectance is preferably selected in order to enhance reflectance of the light by the surface of the base member to thereby improve luminance of light emitted from the light-emitting device. For example, titanium oxide, or potassium titanate can be used.

The surface of the base member irradiated with light from the light-emitting element is preferably made as smooth as possible. This is because specular reflection occurs more easily as the surface becomes smoother, that is, because the quantity of light reflected by the surface of the base member and radiated out can be increased. When the cup-like portion is formed in the base member, the angle of the base member surface forming the cup-like portion can be designed in consideration of light reflecting efficiency in the direction of the optical axis. The angle is preferably selected to be in a range of from 20° to 60°, more preferably in a range of from 20° to 50°, with respect to the optical axis of the light-emitting element.

(Sealing Member)

The sealing member is a member which is formed so that the light-emitting element is covered with the member. The sealing member is mainly provided for protecting the light-emitting element from external environment. At least one portion of the sealing member is made of silicone. That is, the sealing member is constituted by a material at least containing silicone resin, silicone rubber, and/or silicone elastomer. Preferably, silicone rubber is used as one material of the sealing member. Especially preferably, a sealing member made of silicone rubber is used. In this case, it is preferable that silicone rubber exhibiting high transmittance to light emitted from the light-emitting element is used. When such a material is used, light emitted from the light-emitting element can be radiated out efficiently.

Preferably, the sealing member may contain an epoxy group. That is, as a preferred mode, the sealing member is made of silicone rubber containing an epoxy group. In this manner, sufficient adhesion between the sealing member and the base member is obtained, so that both stability and reliability of the light-emitting device are improved. This effect is guessed to be for the following reason. That is, because the polyamide-based resin used as the material of the base member surface contains an amide group in its molecule, a hydrogen atom in the amide group in the base member surface and an oxygen atom in the epoxy group in the sealing member can form a hydrogen bond. In addition, terminal amine in the polyamide-based resin and the epoxy group in the sealing member can form a covalent bond. The epoxy group also plays as a role of a curing agent for the sealing member.

The epoxy group may exist independent of the silicone molecule or may exist as a part of the side chain of the silicone molecule if the epoxy group may be contained in the sealing member.

Any suitable material in consideration of transmittance to light emitted from the light-emitting element, hardness in a cured state, handling property, etc., can be used as the material of the sealing member. For example, silicone rubber obtained by crosslinkage of a mixture of a chief agent and a curing agent represented by the following general formulae can be used as the material of the sealing member.

(Chief Agent)

Chemical Formula 2

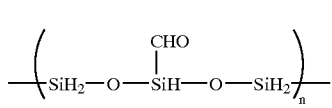

(Curing Agent)

Chemical Formula 3

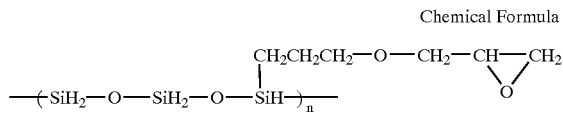

The sealing member may be provided so that a plurality of layers made of different materials respectively are formed by lamination on the light-emitting element. In this case, it is preferable that a layer made of a material durable against light emitted from the light-emitting element, such as a layer of silicone rubber containing an epoxy group, is provided near the light-emitting element.

The sealing member may contain a fluorescent substance. When the fluorescent substance is used, a part of light emitted from the light-emitting element can be converted into light at a different wavelength, that is, the color of light emitted from the light-emitting device can be changed or corrected. An arbitrary fluorescent substance may be used if it can be excited by light emitted from the light-emitting element. The fluorescent substance is selected in consideration of the color of light emitted from the light-emitting device, the durability of the light-emitting device, etc. The fluorescent substance may be dispersed uniformly in the sealing member or may be localized in a partial region. When, for example, the fluorescent substance is localized in the vicinity of the light-emitting element, the fluorescent substance can be efficiently irradiated with light emitted from the light-emitting element.

A combination of a plurality of kinds of fluorescent substances may be contained in the sealing member. In this case, a fluorescent substance which emits light when excited by light from the light-emitting element and a fluorescent substance which emits light when excited by light from the fluorescent substance can be used in combination.

When the sealing member contains a light-diffusing material, light diffusion in the sealing member can be promoted so that emission unevenness can be reduced.

Particularly in the configuration in which the fluorescent substance is used as described above, it is preferable that the light-diffusing material is used to promote color mixing of light from the light-emitting element and light from the fluorescent substance to thereby reduce emission color unevenness.

The configuration of the invention will be described below more in detail with reference to an SMD type light-emitting diode which is an embodiment of the invention.

FIG. 1 is a view typically showing a section of a light-emitting diode 1. The light-emitting diode 1 typically includes a light-emitting element 10, a substrate 20, a reflector 30, and a sealing member 40. The combination of the substrate 20 and the reflector 30 is equivalent to the casing described above. Incidentally, the light-emitting diode 1 further includes a Zener diode not shown but provided for withstanding electrostatic voltage.

Figure 2:
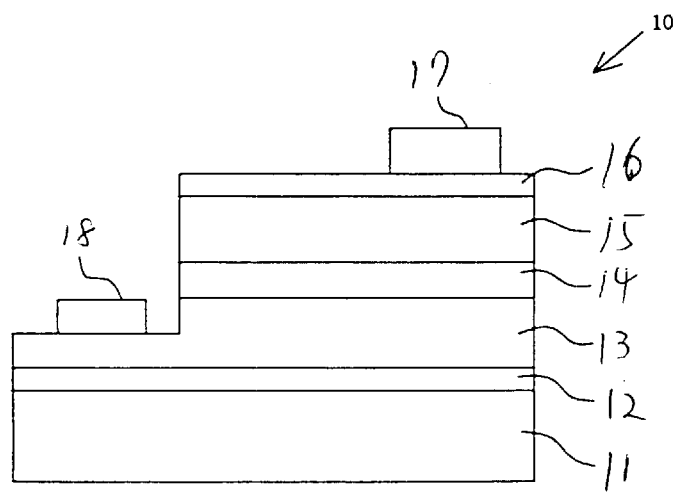
FIG. 2 is a view typically showing the configuration of a light-emitting element which is a constituent member of the light-emitting diode.

The light-emitting element 10 is a Group III nitride compound semiconductor light-emitting element. FIG. 2 typically shows the configuration of the light-emitting element 10. As shown in FIG. 2, the light-emitting element 10 includes a sapphire substrate, and a plurality of Group III nitride compound semiconductor layers laminated on the sapphire substrate. The light-emitting element 10 has an emission peak wavelength at about 380 nm. Specifications of respective layers in the light-emitting element 10 are as follows.

| Layer | Composition |
|---|---|
| p-type semiconductor layer 15 | p-GaN:Mg |
| Layer 14 containing a light-emitting layer4 | Inclusive of InGaN layer |
| n-type semiconductor layer 13 | n-GaN:Si |
| Buffer layer 12 | AlN |
| Substrate 11 | Sapphire |

An n-type semiconductor layer 13 made of GaN doped with Si as n-type impurities is formed on the substrate 11 through the buffer layer 12. Although this embodiment shows the case where a sapphire substrate is used as the substrate 11, the material of the substrate 11 is not limited to sapphire. Examples of the material of the substrate 11 which can be used include sapphire, spinel, silicon, silicon carbide, zinc oxide, gallium phosphate, gallium arsenide, magnesium oxide, manganese oxide, and Group III nitride compound semiconductor monocrystal. Although this embodiment also shows the case where the buffer layer 12 is made of AlN by an MOCVD method, the material of the buffer layer 12 is not limited thereto. For example, GaN, InN, AlGaN, InGaN, or AlInGaN may be used as the material of the buffer layer 12. A molecular beam epitaxy method (MBE method), a halide vapor phase epitaxy method (HVPE method), a sputtering method, an ion-plating method, an electron shower method, etc. may be used as the method for producing the buffer layer 12. When Group III nitride compound semiconductor is used as the substrate 11, the buffer layer 12 can be omitted.

Further, the substrate and the buffer layer may be removed in accordance with necessity after the formation of the semiconductor element.

Although this embodiment shows the case where the n-type semiconductor layer 13 is made of GaN, the invention may be applied also to the case where AlGaN, InGaN or AlInGaN is used as the material of the n-type semiconductor layer 13.

Although this embodiment shows the case where the n-type semiconductor layer 13 is doped with Si as n-type impurities, the invention may be applied also to the case where Ge, Se, Te, or C is used as n-type impurities.

The n-type semiconductor layer 13 maybe of a double-layer structure with an n⁻ layer of low electron density on the light-emitting layer-containing layer 14 side and an n⁺ layer of high electron density on the buffer layer 12 side.

The layer 14 containing a light-emitting layer may contain a quantum well structure (multiple quantum well structure or single quantum well structure). The structure of the light-emitting element may be of a single hetero type, a double hetero type or a homo-junction type.

The layer 14 may contain a Group III nitride compound semiconductor layer provided on the p-type semiconductor layer 15 side, doped with an acceptor such as magnesium and having a wide band gap. This arrangement is made for effectively preventing electrons injected into the light-emitting layer-containing layer 14 from diffusing into the p-type layer 15.

The p-type semiconductor layer 15 made of GaN doped with Mg as p-type impurities is formed on the light-emitting layer-containing layer 14. Alternatively, the p-type semiconductor layer 15 may be made of AlGaN, InGaN or InAlGaN. Zn, Be, Ca, Sr or Ba may be used as p-type impurities instead.

Further, the p-type semiconductor layer 15 may be of a double-layer structure with a p⁻ layer of low hole density on the light-emitting layer-containing layer 14 side and a p⁺ layer of high hole density on the electrode side.

In the light-emitting diode configured as described above, each of the Group III nitride compound semiconductor layers may be formed by an MOCVD method in a general condition or may be formed by a method such as a molecular beam epitaxy method (MBE method), a halide vapor phase epitaxy method (HVPE method), a sputtering method, an ion-plating method, or an electron shower method.

The n-electrode 18 is composed of two layers of Al and V. After the p-type semiconductor layer 15 is formed, the p-type semiconductor layer 15, the layer 14 and then-type semiconductor layer 13 are partially removed by etching. In this condition, the n-electrode 18 is formed on the n-type semiconductor layer 13 by vapor deposition.

The light-transmissive electrode 16 is a thin film containing gold and is laminated on the p-type semiconductor layer 15. The p-electrode 17 is also made of a material containing gold and is formed on the light-transmissive electrode 16 by vapor deposition.

After the respective semiconductor layers and the respective electrodes are formed by these steps, a step of separating the substrate into chips is carried out.

The substrate 20 is an electrically insulating substrate having a surface on which a desired wiring pattern is printed. The light-emitting element 10 is mounted in a desired position of the substrate 20.

The reflector 30 is disposed on the substrate 20 so that a cup-like portion 50 is formed by a combination of the reflector 30 and a part of the surface of the substrate 20. The reflector 30 is made of an aromatic Nylon resin containing potassium titanate dispersed therein uniformly and is molded so that a surface forming the cup-like portion 50 is inclined at a desired angle to the optical axis. In this embodiment, the inclination angle of the surface is selected to be about 30° to the optical axis of the light-emitting element 10.

The sealing member 40 is made of silicone rubber containing an epoxy group as a side chain. The LED 1 configured as described above is produced as follows.

First, the reflector 30 is disposed on the substrate 20. Then, the light-emitting element 10 is mounted, and the electrodes of the light-emitting element 10 are connected to the wiring pattern on the substrate 20 by leads. Then, the surface of the light-emitting element 10 is coated with ceramics not shown. Then, the following chief agent and curing agent are mixed with each other to prepare liquid silicone rubber. The liquid silicone rubber is potted in the cup-like portion 50.

(Chief Agent)

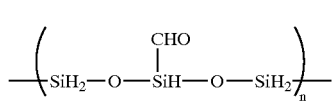

Chemical Formula 4

(Curing Agent)

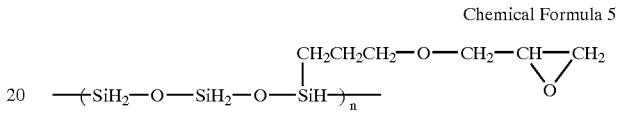

Chemical Formula 5

In this condition, the silicone rubber is heated to about 150° C. to be thermally cured. As a result, the silicone rubber is cured in a state in which the silicone rubber is fitted and bonded to the surface of the reflector 30. Then, heat radiation is performed in air.

Figure 3:
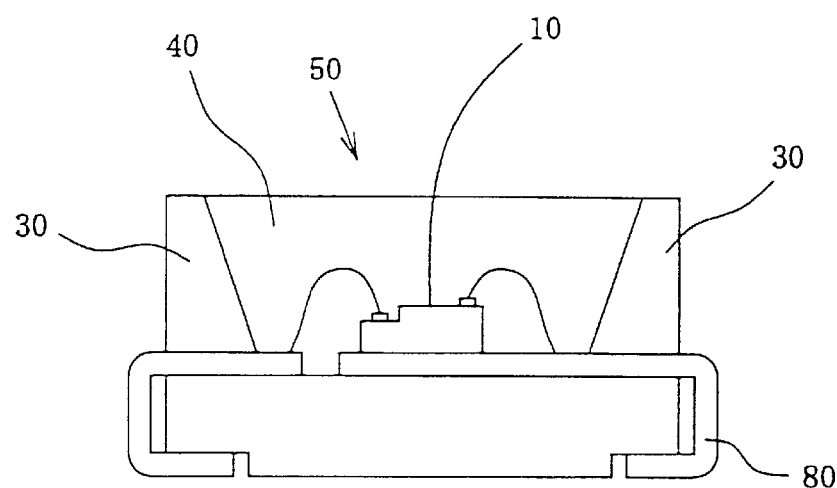
FIG. 3 is a view typically showing the configuration of a light-emitting diode as another embodiment of the invention.

FIG. 3 is a view typically showing the configuration of a light-emitting diode 2 as another embodiment of the invention. In FIG. 3, members the same as those of the light-emitting diode 1 are referenced correspondingly. In the light-emitting diode 2, a lead frame 80 is used instead of the substrate. The light-emitting element 10 is mounted on the lead frame 80. The configuration except this point is the same as that of the light-emitting diode 1.

Figure 4:
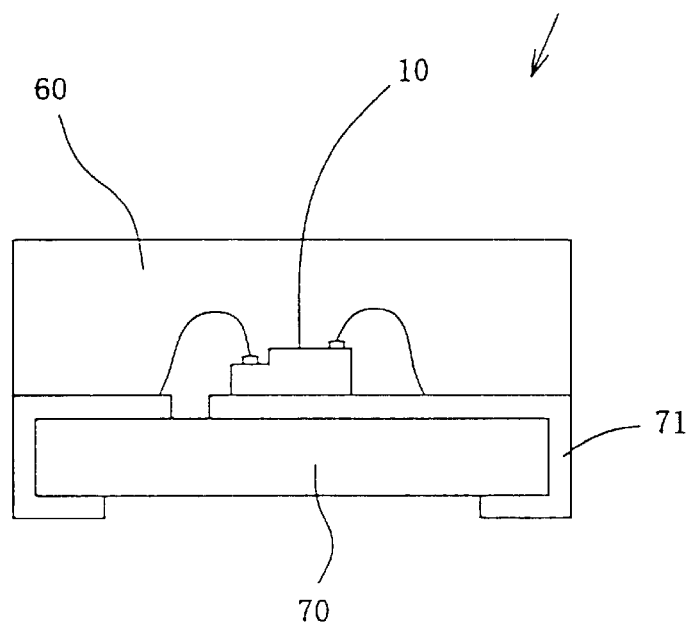
FIG. 4 is a view typically showing the configuration of a light-emitting diode which is a further embodiment of the invention.
Figure 5:
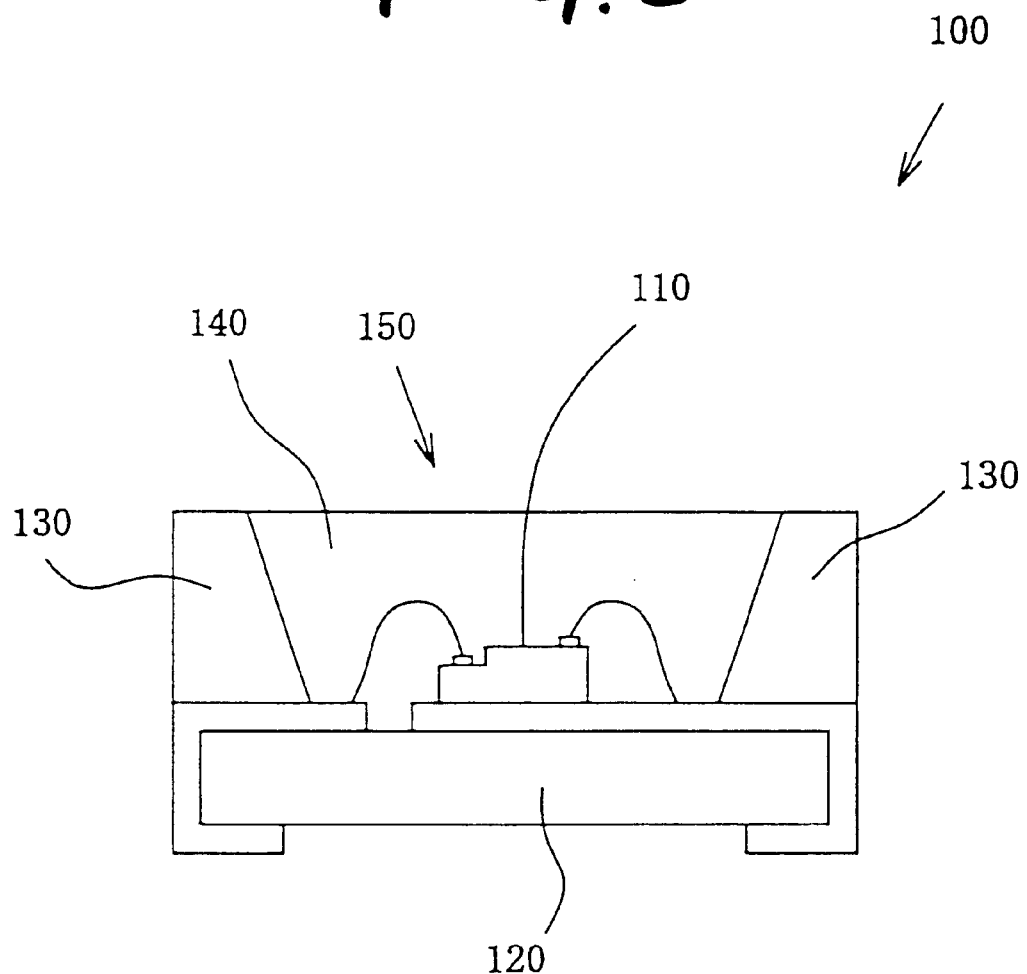
FIG. 5 is a view showing a light-emitting diode configured in the related art.

FIG. 4 is a view typically showing the configuration of a light-emitting diode 3 as a further embodiment of the invention. In FIG. 4, members the same as those of the light-emitting diode 1 are referenced correspondingly. A substrate 70 made of a polyamide-based resin is used in the light-emitting diode 3. Desired wiring 71 is applied on the substrate 70. Further, the light-emitting diode 3 does not use any casing (reflector). As shown in FIG. 4, a sealing member 60 substantially shaped like a rectangle in section is formed so that the light-emitting element 10 is covered with the sealing member 60. The sealing member 60 can be formed by a method including the steps of: mounting the light-emitting element 10 on the substrate 70; and performing molding by using a desired mold. Alternatively, a sealing member 60 molded into a desired shape in advance may be prepared so that the sealing member 60 is bonded to the substrate 70 so that the light-emitting element 10 is covered with the sealing member 60.

Although SMD type light-emitting diodes have been described as embodiments of the invention, the invention may be applied also to so-called round type light-emitting diodes in each of which a light-emitting element is mounted on a lead frame having a cup-like portion and in which the light-emitting element and the lead frame are partially covered with a sealing member. In addition, the invention may be applied to flip chip type light-emitting diodes in each of which a light-emitting element is mounted on a substrate or a lead frame in the form of a so-called flip chip.

The invention is not limited at all to the description of the mode for carrying out the invention. The invention includes various modifications that can be conceived easily by those skilled in the art, without departing from the description of the scope of claims.

What is claimed is:

1. A light-emitting device comprising:
    a base member;
    a semiconductor light-emitting element mounted on said base member; and
    a sealing member, said semiconductor light-emitting element being coated with said sealing members,
    wherein at least one portion of said base member comprises a polyamide-based resin, and at least one portion of said sealing member comprises silicone, said silicone comprising an epoxy group for adhering to said at least one portion of said base member.

2. The light-emitting device according to claim 1, wherein said base member comprises a casing comprising a polyamide-based resin, and a substrate made of another material and bonded to said casing so that a cavity portion is formed.

3. The light-emitting device according to claim 1, wherein said base member comprises a polyamide-based resin, and a lead frame inserted in said polyamide-based resin.

4. The light-emitting device according to claim 1, wherein said base member comprises a substrate comprising a polyamide-based resin.

5. The light-emitting device according to claim 1, wherein said semiconductor light-emitting element exhibits an emission path in a wavelength range of not longer than 500 nm.

6. The light-emitting device according to claim 1, wherein said polyamide-based resin comprises an aromatic Nylon resin.

7. The light-emitting device according to claim 1, wherein said epoxy group acts as a curing agent for said sealing member.

8. The light-emitting device according to claim 1, wherein said silicone comprise silicone rubber.

9. The light-emitting device according to claim 1, wherein said semiconductor light-emitting element exhibits an emission peak in a wavelength range of not longer than 400 nm.

10. The light-emitting device according to claim 1, wherein said polyamide-based resin comprises a light-reflective filler.

11. The light-emitting device according to claim 1, wherein said silicone comprises at least one of silicone resin, silicone rubber, and silicone elastomer.

12. The light-emitting device according to claim 1, wherein said silicone comprises an epoxy group which forms a bond with an amide group of said polyamide-based resin.

13. The light-emitting device according to claim 1, wherein said silicone comprises an epoxy group which forms a bond with a terminal amine of said polyamide-based resin.

14. The light-emitting device according to claim 1, wherein said semiconductor light-emitting element comprises a group III nitride compound semiconductor.

15. The light-emitting device according to claim 1, wherein said base member comprises a reflector portion comprising a white filler material.

16. The light-emitting device according to claim 1, wherein said polyamide-based resin comprises an aromatic polyamide-based resin.

17. The light-emitting device according to claim 1, wherein said sealing member further comprises at least one of a fluorescent material and a light-diffusing material.

18. The light-emitting device according to claim 1, wherein said base member comprises a surface forming an angle of 20° to 60° with respect to an optical axis of said light-emitting element.

19. A light-emitting device comprising:
    a base member comprising a bottom portion and a reflector portion;
    a semiconductor light-emitting element formed on said bottom portion of said base member; and
    a sealing member formed on said semiconductor light-emitting element,
    wherein at least one portion of said base member comprises a polyamide-based resin, and at least one portion of said sealing member comprises silicone, said silicone comprising an epoxy group for adhering to said at least one portion of said base member.

20. A method of forming a light-emitting device, said method comprising:
    forming a base member comprising a bottom portion and a reflector portion;
    forming a semiconductor light-emitting element on said bottom portion of said base member; and
    forming a sealing member on said semiconductor light-emitting element,
    wherein at least one portion of said base member comprises a polyamide-based resin, and at least one portion of said sealing member comprises silicone, said silicone comprising an epoxy group for adhering to said at least one portion of said base member.

* * * * *